(12) United States Patent
Kuo et al.

(10) Patent No.: US 7,990,732 B2
(45) Date of Patent: Aug. 2, 2011

(54) BRACKET AND ELECTRONIC DEVICE UTILIZING THE BRACKET

(75) Inventors: Che-Yu Kuo, Taipei Hsien (TW); Li-Ping Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/719,820

(22) Filed: Mar. 8, 2010

(65) Prior Publication Data

US 2011/0103012 A1   May 5, 2011

(30) Foreign Application Priority Data

Oct. 29, 2009   (CN) .................. 2009 2 0313666 U

(51) Int. Cl.
*H05K 5/00* (2006.01)

(52) U.S. Cl. .................. 361/754; 361/803; 361/810

(58) Field of Classification Search .......... 361/754, 361/807, 810, 752, 730, 790, 797, 679.01, 361/724–728, 736, 747, 759, 784, 796, 798–803; 312/223.1, 223.2; 439/55, 61, 296, 325, 327, 374, 377

See application file for complete search history.

(56) References Cited

U.S. PATENT DOCUMENTS

| 6,350,140 | B1 * | 2/2002 | Gallagher et al. | ............ 439/327 |
| 6,738,261 | B2 * | 5/2004 | Vier et al. | ...................... 361/740 |
| 7,326,077 | B2 * | 2/2008 | Shih et al. | ...................... 439/372 |

* cited by examiner

*Primary Examiner* — Hung S Bui
(74) *Attorney, Agent, or Firm* — D. Austin Bonderer

(57) ABSTRACT

A bracket is used for retaining an expansion card. The expansion card includes a slot cover. The bracket includes a top and a back and a retaining member. The top is perpendicular to the back. The back defines at least one expansion slot. The retaining member comprises an elongated body. The retaining member is pivotally attached to the top about a pivot axis. The pivot axis is substantially perpendicular to the back. The retaining member is capable of securing the slot cover to the mounting flange of the back at a locked position.

10 Claims, 3 Drawing Sheets

BRACKET AND ELECTRONIC DEVICE UTILIZING THE BRACKET

BACKGROUND

1. Technical Field

The present disclosure relates to expansion devices, and more particularly to a bracket for mounting expansion cards and an electronic device utilizing the bracket.

2. Description of Related Art

An expansion card in computing is a printed circuit board that can be inserted into an expansion slot of a computer motherboard to add additional functionality to a computer system. Expansion cards are often fixed to computer motherboard by screws, which not only requires screws be provided, but also a screwdriver. In this way, operation is time-consuming and troublesome. In addition, screws are easily lost. If a screw is lost in the electronic device and not removed, damage may occur when the electronic device is powered up.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
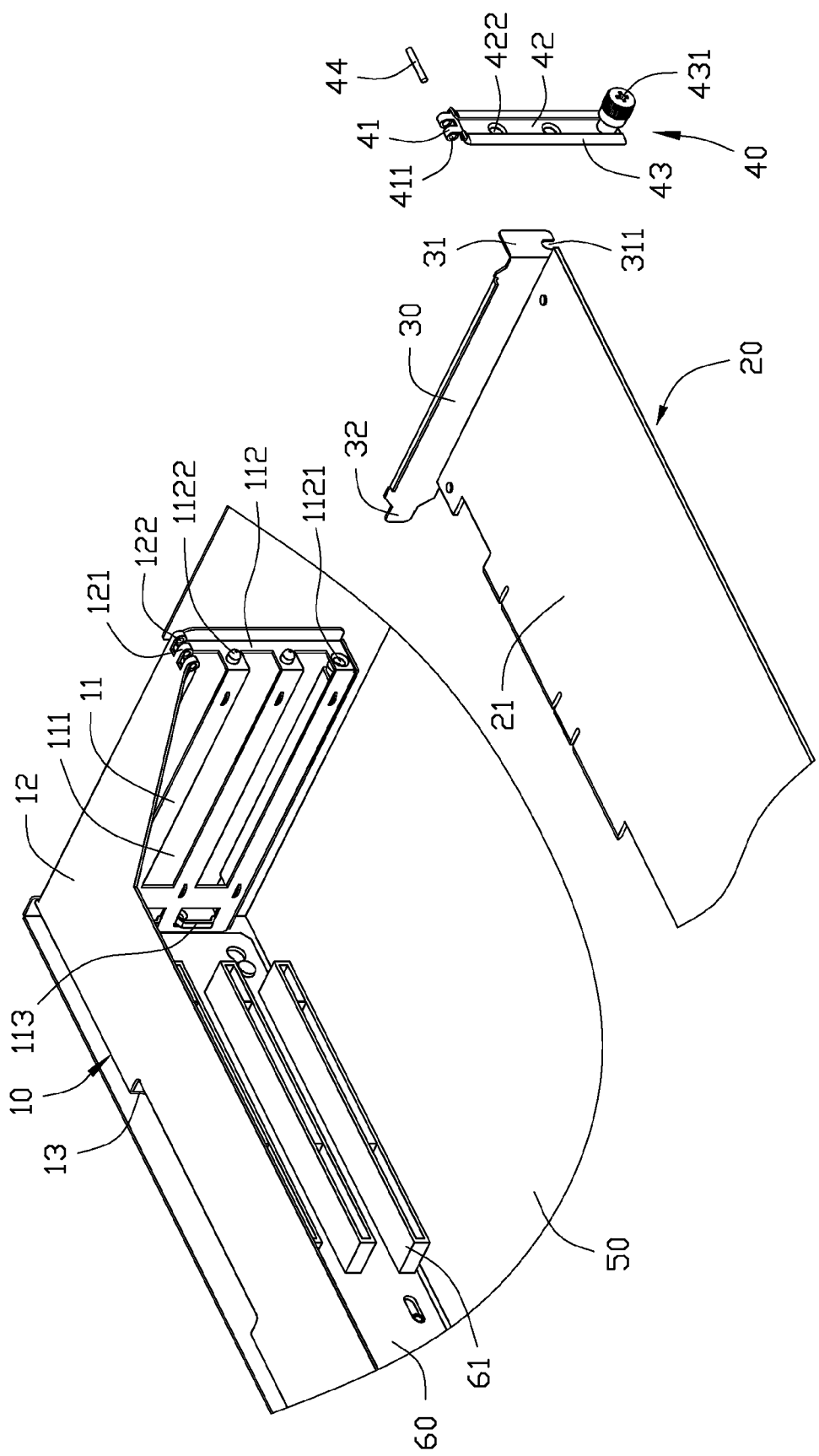
FIG. 1 is an exploded, isometric view of an embodiment of an electronic device as disclosed.

Referring to FIG. 1, an embodiment of an electronic device as disclosed includes a chassis 50, a bracket 10 located on the chassis 50, and a motherboard 60 located in the bracket 10. The motherboard 60 has at least one connector 61 for connection to the expansion card 20. The expansion card 20 can be mounted to the bracket 10.

The expansion card 20 can include a printed circuit board (PCB) 21 and a slot cover 30 mounted to the PCB 21. The slot cover 30 includes a bent clip 31 and a reduced end portion 32. A cutout 311 is defined by the bent clip 31.

The bracket 10 includes a sidewall 13, a top 12, a back 11 and a locking member 40 pivotally attached to the top 12 or the back 11. The sidewall 13 is perpendicular to the top 12, and the back 11 is perpendicular to the sidewall 13 and the top 12. The back 11 defines a plurality of parallel expansion slots 111. The back 11 includes at least one bridge portion 113 that receives the end portion 32. A mounting flange 112 is perpendicular to the back 11. The expansion slots 111 reach the mounting flange 112. At least one positioning post 1122 protrudes from the mounting flange 112. The mounting flange 112 defines a locking hole 1121. The top 12 has a first pivoting member 121. The first pivoting member 121 can have at least one first curling portion 122. In one embodiment, the first pivoting member 121 has three spaced curling portion 122.

In one embodiment, the locking member 40 is pivotally attached to the top 12 at the first pivoting member 121 through a pivot pin 44. The locking member 40 includes an elongated body 42 and a second pivoting member 41. The second pivoting member 41 can have two spaced second curling portions 411. The body 42 can have two opposite bent rims 43. The bent rims 43 are bent inward 180°. The body 42 defines at least one positioning hole or recess 422. A fastener 431 is attached to the locking member 40 to secure the locking member 40 to the mounting flange 112. The fastener 431 may be a thumb screw.

Figure 2:
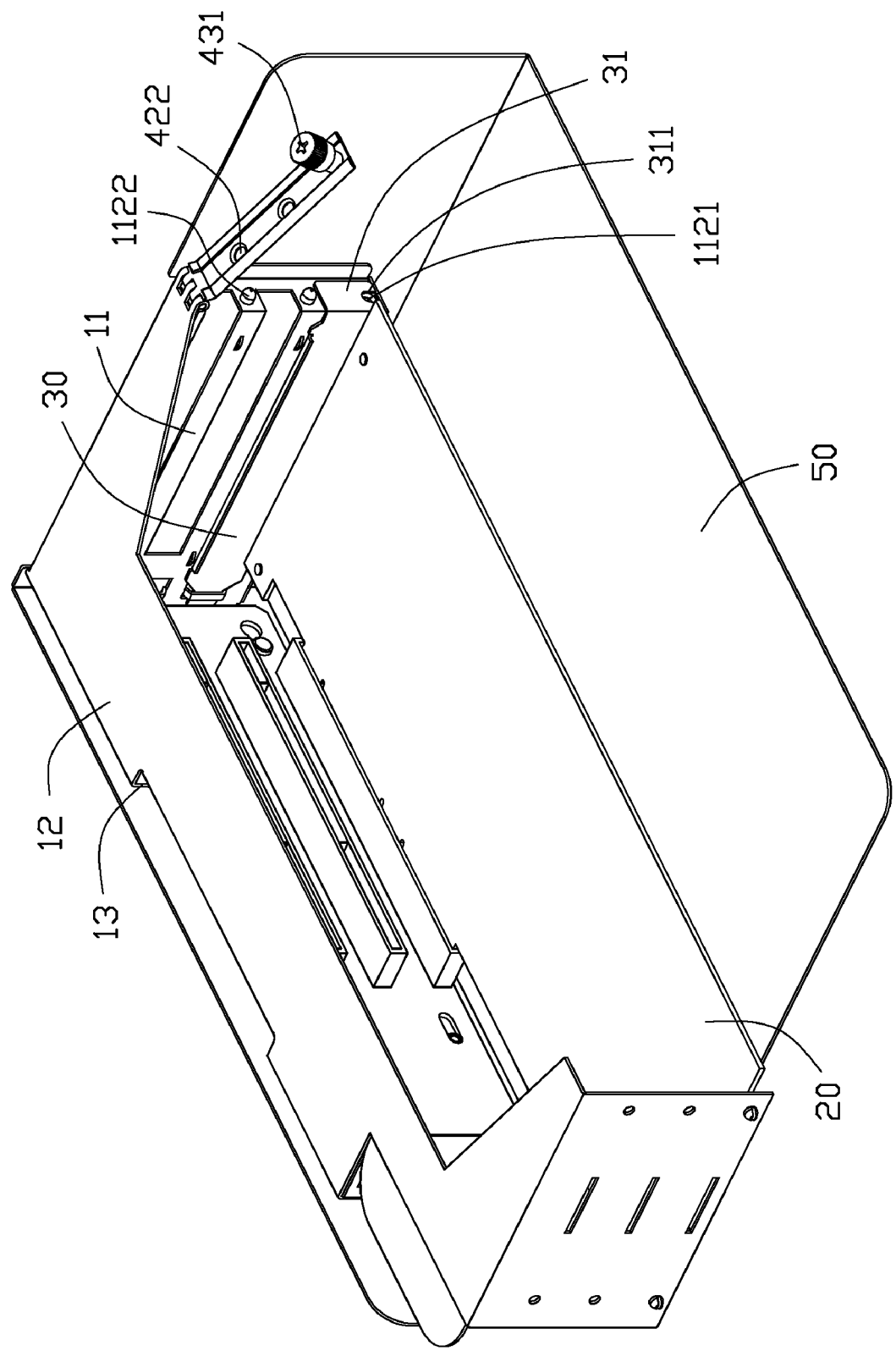
FIG. 2 is an assembled, isometric view of an embodiment of a bracket.

Referring to FIG. 2, during assembly of the bracket, the motherboard 60 is mounted to the sidewall 13. The locking member 40 is pivotally connected to top 12 with pivot pin 44 extending through the first pivoting member 121 and the second pivoting member 41. In detail, the pivot pin 44 extends through the first curling portions 122 and the second curling portions 411. The second curling portions 411 are located between the first curling portions 411.

Figure 3:
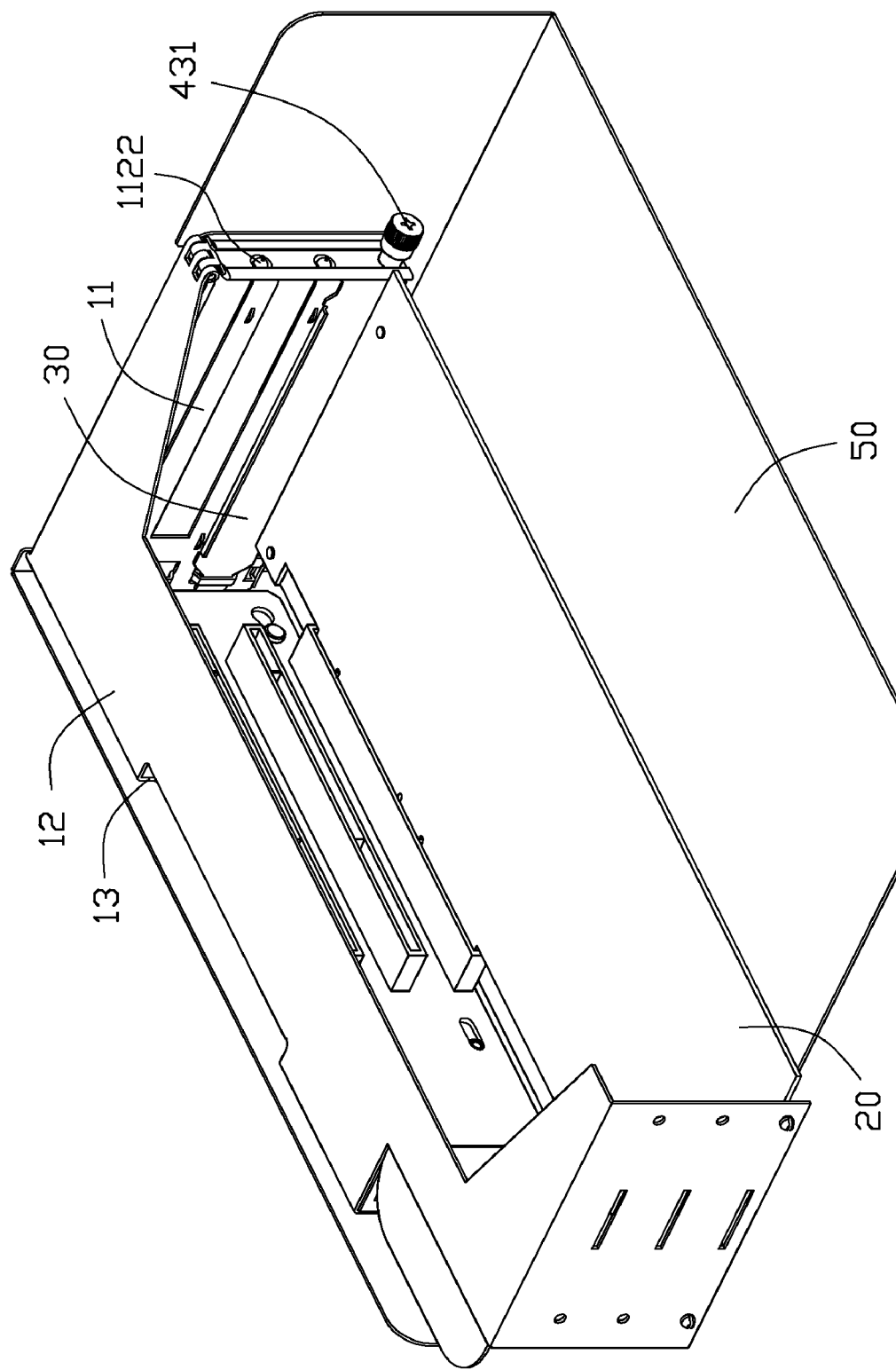
FIG. 3 shows an expansion card fixed in the bracket by a locking member.

Referring to FIG. 2 and FIG. 3, during mounting of the expansion card 20, the locking member 40 is rotated away from the mounting flange 112. The PCB 21 is received in the connector 60, and the end portion 32 is received in the bridge portion 113. The slot cover 30 covers the expansion slot 111. The bent clip 31 covers the mounting flange 112. The locking member 40 is rotated toward the mounting flange 112, until the body 42 abuts the mounting flange 112. The positioning post 1122 is received in the corresponding recess 422 to position the locking member 40. The bent clip 112 is sandwiched between the mounting flange 112 and the locking member 40. The fastener 431 is then threaded into the retaining hole 1121 to secure the locking member 40 to the bracket 10. For removal of the expansion card 20, the fastener 431 is withdrawn, and the locking member 40 is rotated away from the mounting flange 112. The expansion card 20 can be removed from the bracket 10.

It is also to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A bracket for retaining an expansion card comprising a slot cover, the bracket comprising:
   a top;
   a back, the back generally perpendicular to the top, the back defining at least one expansion slot, and a mounting flange bent from the back; and
   a locking member comprises of an elongated body and pivotally attached to the top about a pivot axis, the pivot axis substantially perpendicular to the back;
   wherein the slot cover is secured to the mounting flange of the back in a locked position with the locking member; the locking member is pivotally attached to the top through a pivot pin; the top comprises a first pivoting member; the locking member comprises a second pivoting member; the first pivoting member comprises at least one first curling portion; the second pivoting member comprises at least one second curling portion; the at least one second curling portion is adjacent to the at least one first curling portion; and the pivot pin extends through the at least one first curling portion and the at least one second curling portion.

2. The bracket of claim 1, wherein at least one positioning post protrudes from the mounting flange, and the locking member defines at least one recess that receives the positioning post.

3. The bracket of claim 1, wherein a fastener is attached to the locking member, and the mounting flange defines a locking hole corresponding to the fastener.

4. The bracket of claim 3, wherein the fastener is a thumb screw.

5. The bracket of claim 1, wherein the body comprises two opposite bent rims, bent inward 180°.

6. An electronic device comprising:
  an expansion card comprising a slot cover, the slot cover comprising a bent clip;
  a bracket for mounting the expansion card, the bracket comprising:
    a top;
    a back, the back perpendicular to the top, the back defining at least one expansion slot for receiving the slot cover, and a mounting flange bent from the back; and
    a locking member comprises of an elongated body and pivotally attached to the top about a pivot axis, the pivot axis being substantially perpendicular to the back;
  wherein the bent clip is secured to the mounting flange of the back in a locked position with the locking member; the locking member is pivotally attached to the top through a pivot pin; the top comprises a first pivoting member; the locking member comprises a second pivoting member; the first pivoting member comprises at least one first curling portion; the second pivoting member comprises at least one second curling portion; the at least one second curling portion is adjacent to the at least one first curling portion; and the pivot pin extends through the at least one first curling portion and the at least one second curling portion.

7. The electronic device of claim 6, wherein at least one positioning post protrudes from the mounting flange, and the locking member defines at least one recess that receives the positioning post.

8. The electronic device of claim 6, wherein a fastener is attached to the locking member, and the mounting flange defines a locking hole corresponding to the fastener.

9. The electronic device of claim 8, wherein the fastener is a thumb screw.

10. The electronic device of claim 6, wherein the body comprises two opposite bent rims, the bent rims bent inward 180°.

* * * * *